(12) United States Patent
Huang et al.

(10) Patent No.: US 7,115,477 B2
(45) Date of Patent: Oct. 3, 2006

(54) GATE WITH DUAL GATE DIELECTRIC LAYER AND METHOD OF FABRICATING THE SAME

(75) Inventors: Chung-Lin Huang, Taichung (TW); Ying-Cheng Chuang, Taoyuan Hsien (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 10/884,769

(22) Filed: Jul. 2, 2004

(65) Prior Publication Data

US 2004/0241937 A1 Dec. 2, 2004

Related U.S. Application Data

(62) Division of application No. 10/443,950, filed on May 22, 2003, now abandoned.

(30) Foreign Application Priority Data

Sep. 25, 2002 (TW) ................. 91121992 A (51) Int. Cl.
*H01L 21/336* (2006.01)
(52) U.S. Cl. ...................... 438/270; 257/330
(58) Field of Classification Search ............... 438/259, 438/270, 574, 585, 591, 595; 257/283, 324, 257/330–334, 350, 401
See application file for complete search history.

(56) References Cited

U.S. PATENT DOCUMENTS

| 5,801,075 | A  | * | 9/1998 | Gardner et al. | ............. 438/197 |
| 6,169,003 | B1 | * | 1/2001 | Hu et al. | ................... 438/299 |
| 6,287,926 | B1 | * | 9/2001 | Hu et al. | ................... 438/306 |
| 6,346,438 | B1 | * | 2/2002 | Yagishita et al. | ........... 438/197 |

* cited by examiner

*Primary Examiner*—David Vu
(74) *Attorney, Agent, or Firm*—Quintero Law Office (57) ABSTRACT

A gate with dual gate dielectric layer and fabrication method thereof. A semiconductor substrate is provided, on which a dielectric layer and a patterned hard mask layer with an opening are sequentially formed. A spacer is formed on a sidewall of the opening. The semiconductor substrate is ion implanted, the spacer and the exposed dielectric layer are removed, and a gate oxide layer is formed on the bottom of the opening.

14 Claims, 9 Drawing Sheets

GATE WITH DUAL GATE DIELECTRIC LAYER AND METHOD OF FABRICATING THE SAME

This application is a divisional of U.S. application Ser. No. 10/443,950, filed May 22, 2003 now abandoned.

BACKGROUND OF THE INVENTION

1. Field of the Invention

The invention relates to a method for fabricating a gate dielectric layer, and more particularly a dual gate dielectric layer.

2. Description of the Related Art

A gate dielectric layer, such as silicon oxide layer, is a dielectric formed under a gate of a MOS. MOS evokes electric charge in a channel through the gate dielectric layer, improving the quality of the gate dielectric layer.

Figure 1A:
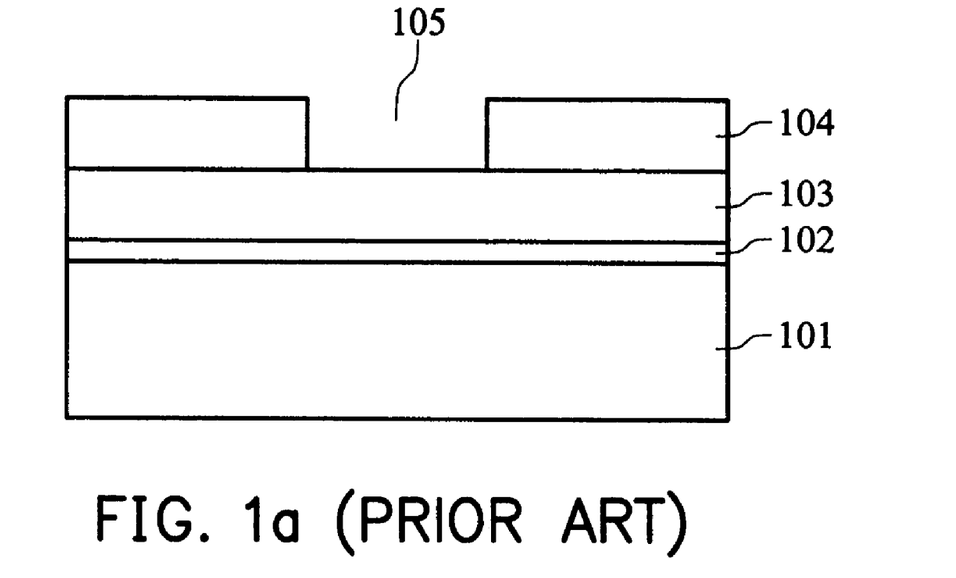
FIGS. 1a to 1e are cross-sections of a conventional method for fabricating a gate with a gate dielectric layer.

FIGS. 1a to 1e are cross-sections of a conventional method for fabricating a gate with a gate dielectric layer;

In FIG. 1a, a semiconductor substrate 101, such as silicon substrate, is provided. A dielectric layer 102, such as pad oxide layer, a hard mask layer 103, such as LPCVD nitride layer, and a patterned photoresist layer 104 with an opening 105 are sequentially formed on the surface of the semiconductor substrate 101, wherein the position of the opening 105 is the position a gate formed in the subsequent process.

Figure 1B:
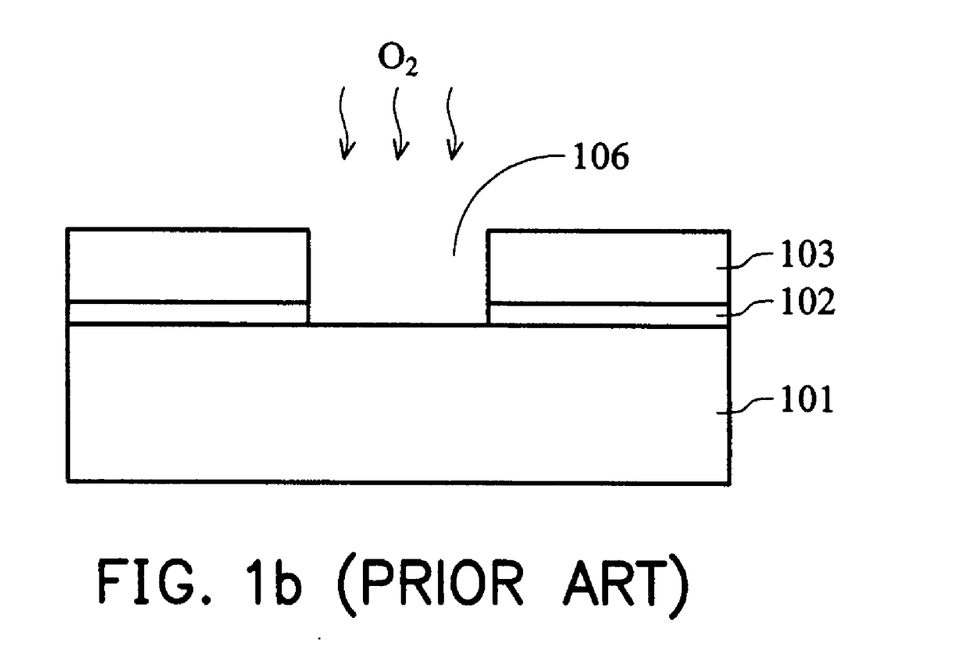

In FIG. 1b, the hard mask layer 103 is etched to form an opening 106 using the patterned photoresist layer 104 as a mask, wherein the opening 106 exposes the surface of the semiconductor substrate 101.

Figure 1C:
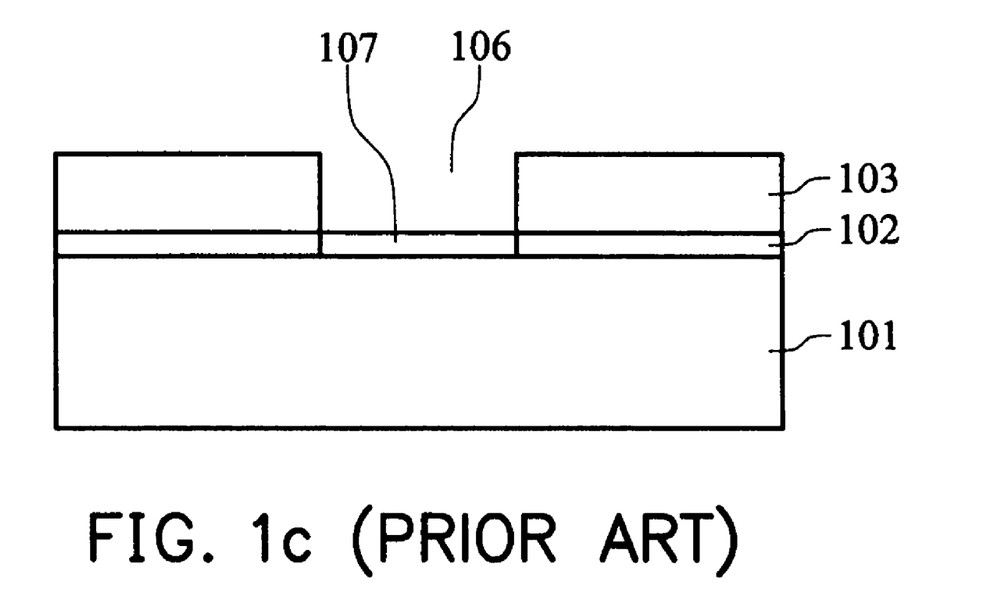

In FIG. 1c, the semiconductor substrate 101 is thermally oxidized to form a gate dielectric layer 107, such as gate oxide layer, on the bottom surface of the opening 106.

Figure 1D:
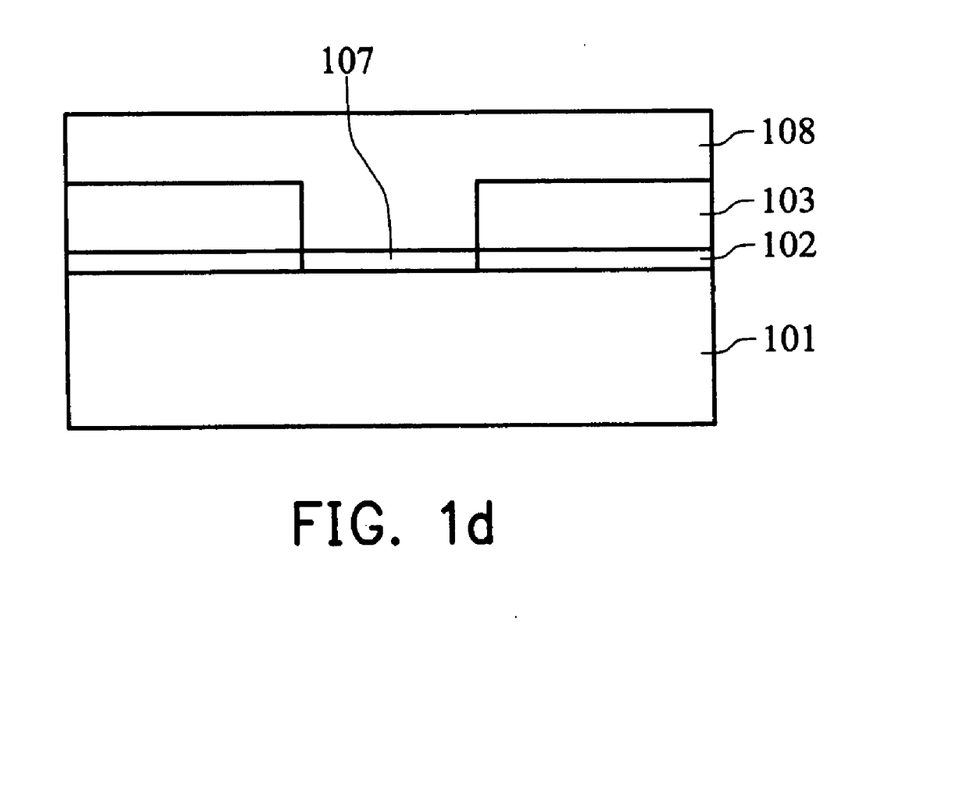

In FIG. 1d, a conducting layer 108, such as polysilicon or epi-silicon, is formed on the hard mask layer 103, wherein the opening 106 is filled with the conducting layer 108.

Figure 1E:
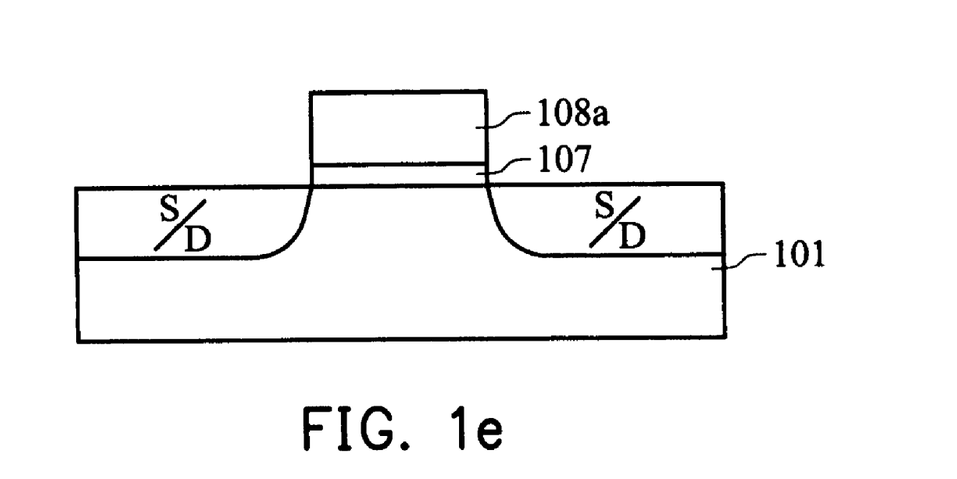

In FIG. 1e, the conducting layer 108 is planarized to expose the surface of the hard mask layer 103. The hard mask layer 103 and the dielectric layer 102 are sequentially removed to leave the conducting layer 108a as a gate. S/D area is formed in the semiconductor substrate 101 in the subsequent process, and a MOS with gate with the gate dielectric layer 107 is complete.

The conventional method will fabricate a MOS with one gate dielectric thickness. The thickness of the gate dielectric layer is less when the size of the element is reduced. In order to reduce the GIDL (gate induced gate leakage) effect and gate to S/D leakage, after gate patterned, the gate is oxidized to gain a thicker dielectric thickness at the gate edge. This traditional gate re-oxidation method is hard to control the mini-bird-beak length into the gate at the gate edge. In this invention, a dual gate dielectric thickness to achieve thin dielectric thickness at gate center and thick dielectric thickness at gate edge is fabricated. The gate length of thick gate dielectric can be precisely controlled with a spacer implant mask, which means the device performance can be précised controlled. Device fabrication with more process window will be achieved with the two independent gate dielectric thickness fabrication at the same time.

SUMMARY OF THE INVENTION

The present invention is directed to a gate with dual gate dielectric layer and a method of fabricating the same.

Accordingly, the present invention provides a method for forming a gate with dual gate dielectric layer. A semiconductor substrate is provided. A dielectric layer and a patterned hard mask layer with an opening are sequentially formed on the semiconductor substrate. A spacer is formed on a sidewall of the opening. Nitrogen ions are implanted into the semiconductor substrate. The spacer and the exposed dielectric layer are removed. A gate oxide layer is formed on a bottom of the opening. A conducting layer is formed in the opening. The hard mask layer is removed.

Accordingly, the present invention also provides a method for fabricating a gate with dual gate dielectric layer. A semiconductor substrate is provided. A dielectric layer, a hard mask layer, and a patterned photoresist layer with a first opening are sequentially formed on the semiconductor substrate, wherein the first opening exposes a partial surface of the hard mask layer. The hard mask layer is etched to form a second opening using the patterned photoresist layer as a mask, and the patterned photoresist layer is removed. An insulating layer is conformally formed on the surface of the hard mask layer and the second opening. The insulating layer is anisotropically etched to form a spacer on a sidewall of the second opening. Nitrogen ions are implanted into the semiconductor substrate using the hard mask layer and the spacer as masks. The spacer is removed. The semiconductor substrate is thermally oxidized to form a gate oxide layer on the bottom of the second opening using the hard mask layer as a mask. A conducting layer is formed on the hard mask layer, and the second opening is filled with the conducting layer. The conducting layer is planarized to expose a surface of the hard mask layer, and the hard mask layer is removed.

Accordingly, the present invention provides a gate with dual gate dielectric layer, comprising a dual gate dielectric layer and a conducting layer. The dual gate dielectric layer is formed on the semiconductor substrate, comprising an inner portion and an outer portion, where the inner portion is thinner than the outer portion. The conducting layer is formed on the dual gate dielectric layer.

Accordingly, the present invention also provides a gate with dual gate dielectric layer, comprising a semiconductor substrate, a dual gate dielectric layer, and a conducting layer. The dual gate dielectric layer is formed on the semiconductor substrate. The dual gate dielectric layer comprises a first gate dielectric layer and a second gate dielectric layer, wherein the second gate dielectric layer is formed closer to the center than the first gate dielectric layer, and the thickness of the second gate dielectric layer is thinner than the first gate dielectric layer. The conducting layer is formed on the dual gate dielectric layer.

BRIEF DESCRIPTION OF THE DRAWINGS

For a better understanding of the present invention, reference is made to a detailed description to be read in conjunction with the accompanying drawings, in which.

DETAILED DESCRIPTION OF THE INVENTION

FIGS. 2a to 2l are cross-sections of the method for fabricating a MOS with dual gate dielectric layer of the present invention.

Figure 2A:
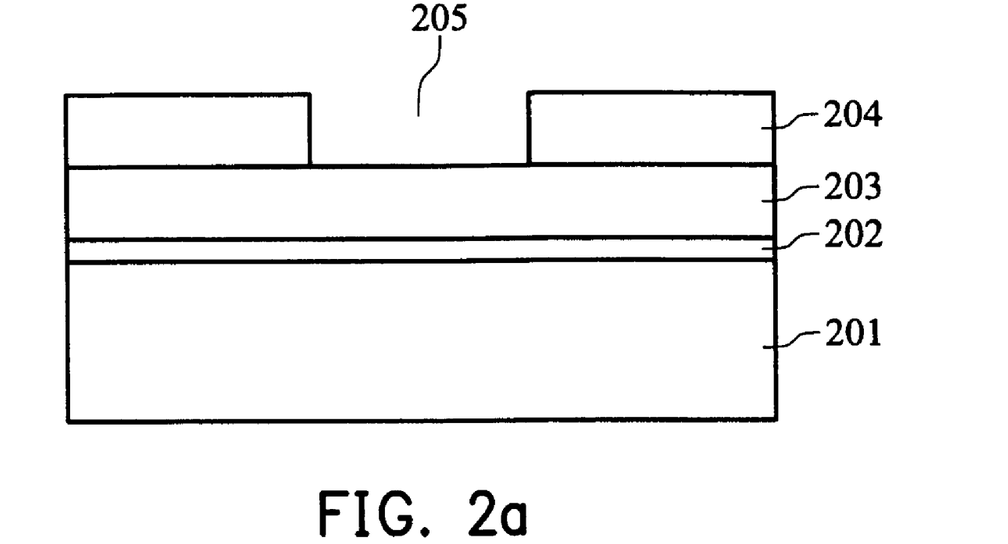
FIGS. 2a to 2l are cross-sections of the method for fabricating a MOS with dual gate dielectric layer of the present invention.

In FIG. 2a, a semiconductor substrate 201, such as silicon substrate, is provided, on which a dielectric layer 202, such as pad oxide layer, a hard mask layer 203, such as LPCVD nitride layer, and a patterned photoresist layer 204 with an opening 205 are sequentially formed. The LPCVD nitride layer is deposited using $SiCl_2H_2$ and $NH_3$ as reactive gas at 250 to 400° C. The position of the opening 205 is the position of a dual gate dielectric layer in the subsequent process, and the opening 205 exposes the surface of the hard mask layer 203.

Figure 2B:
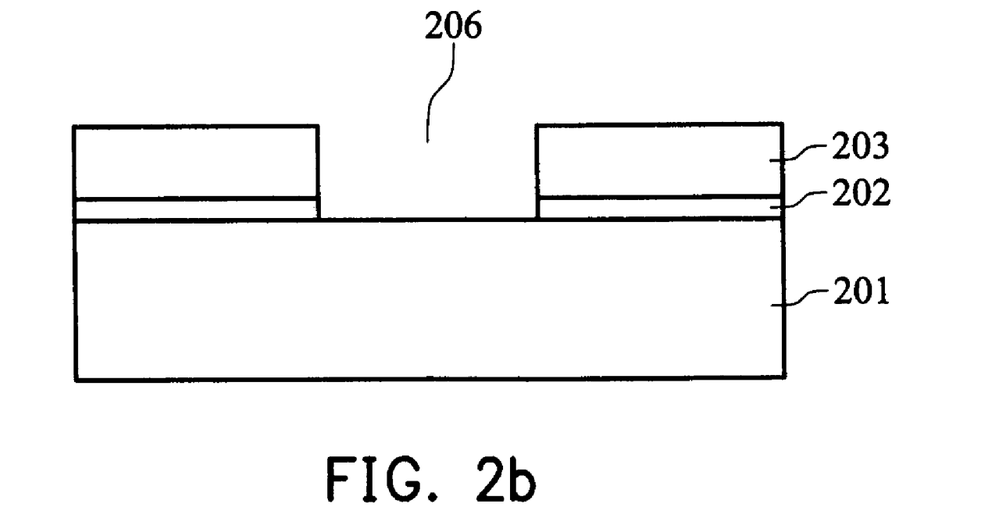

In FIG. 2b, the hard mask layer 203 is etched using the patterned photoresist layer 204 to form an opening in the hard mask layer 203, wherein the opening exposes the surface of the semiconductor substrate 201.

Figure 2C:
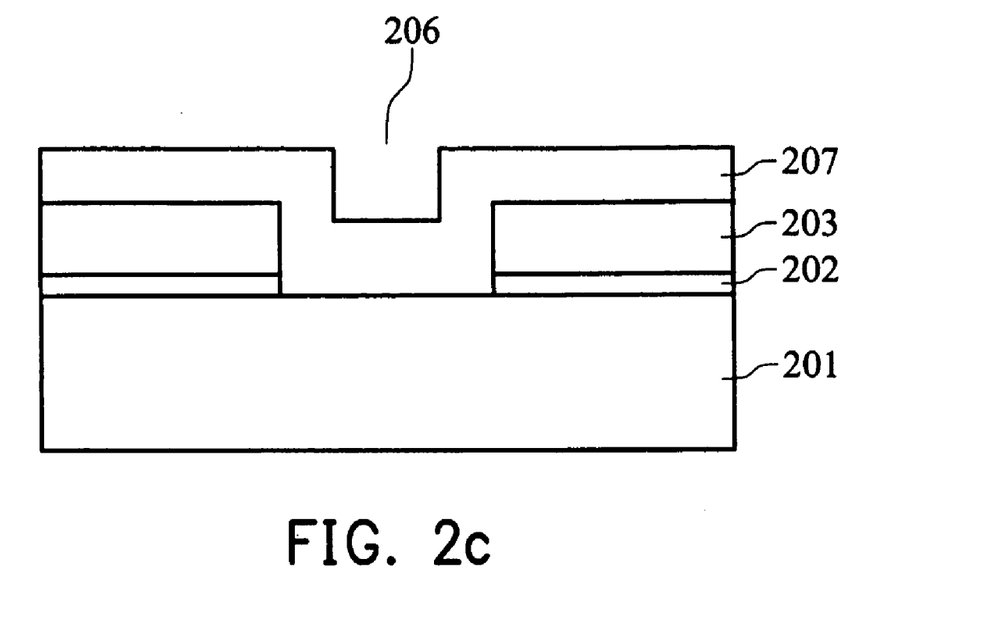

In FIG. 2c, a first insulating layer 207, such as LPCVD oxide layer or PECVD oxide layer, is conformally formed on the surface of the hard mask layer 203 and the opening 206, wherein the LPCVD oxide layer or PECVD oxide layer is deposited at 350 to 850° C.

Figure 2D:
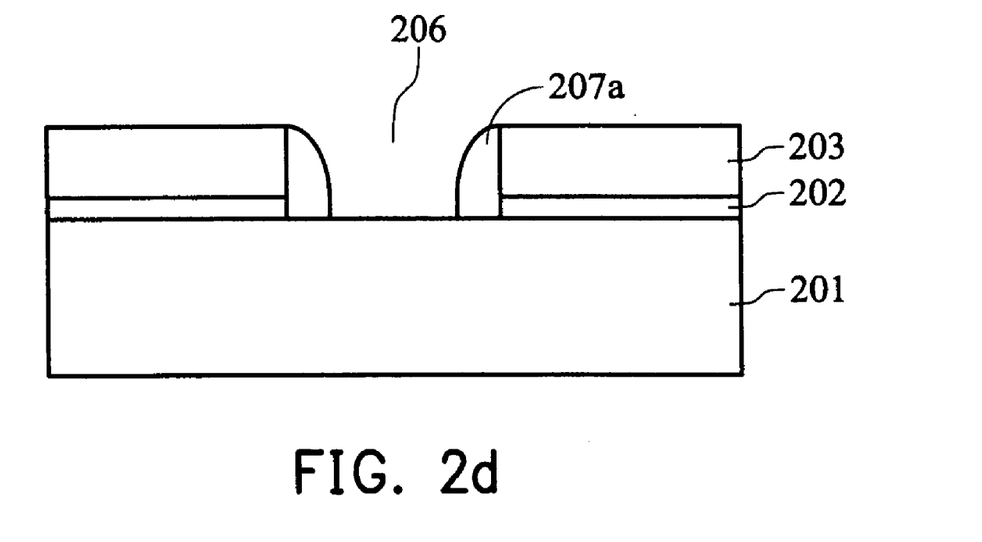

In FIG. 2d, the insulating layer 207 is anisotropically etched to form a first spacer 207a on a sidewall of the opening 206, wherein the anisotropic etching comprises reactive ion and plasma etching.

Figure 2E:
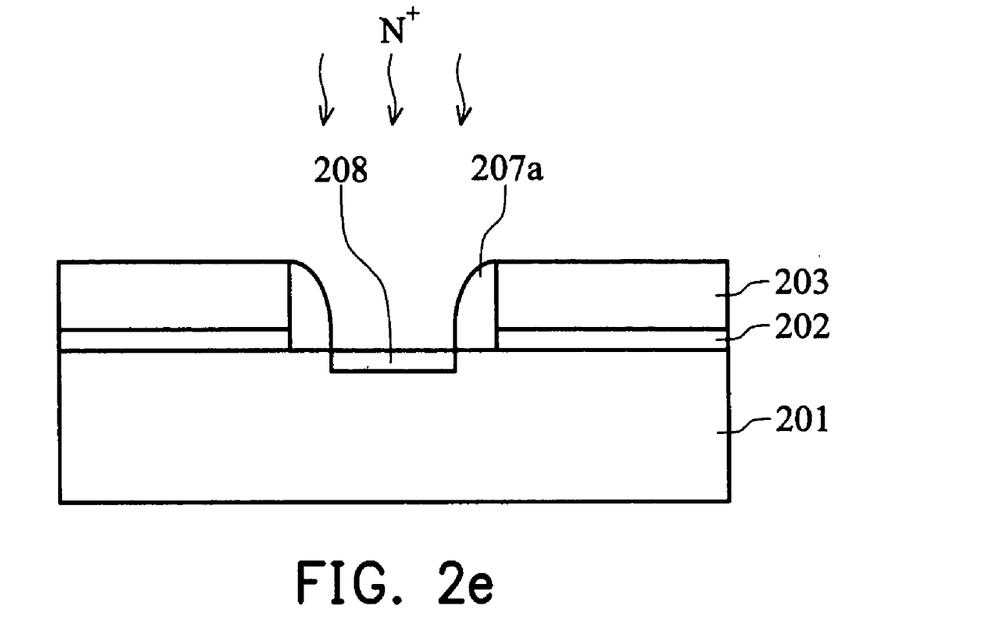

In FIG. 2e, ions are implanted into the semiconductor substrate 201 to form an ion implanting area 208 using the hard mask 203 and the first spacer 207a as masks. The ion comprises nitrogen ion.

Figure 2F:
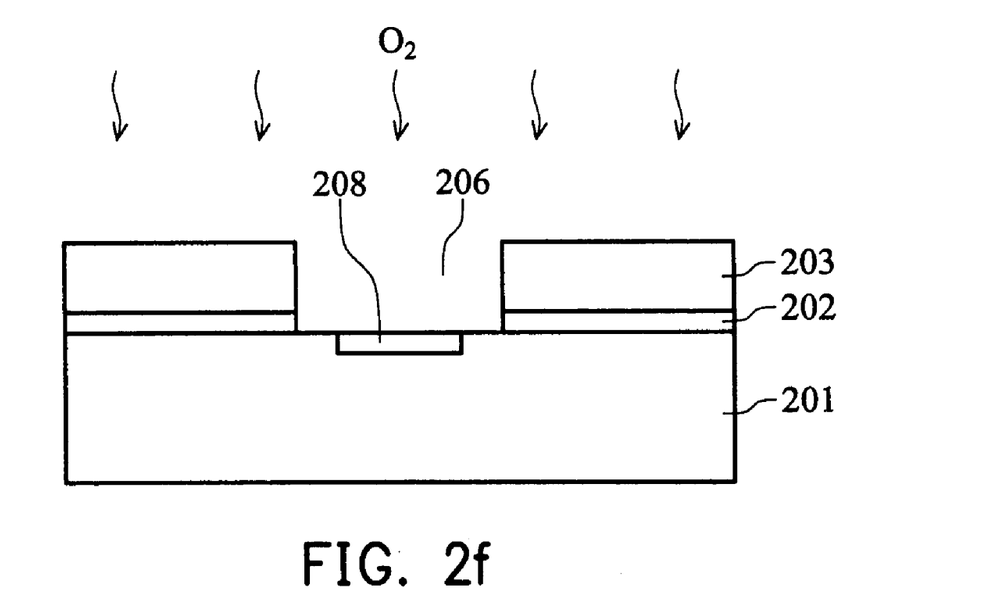

In FIG. 2f, the first spacer 207a is removed in the opening 206. The semiconductor substrate 201 is thermally oxidized to form a gate dielectric layer 209, such as gate oxide layer, on the bottom of the opening 206 at 750 to 950° C. using the hard mask layer 203 as a mask.

Figure 2G:
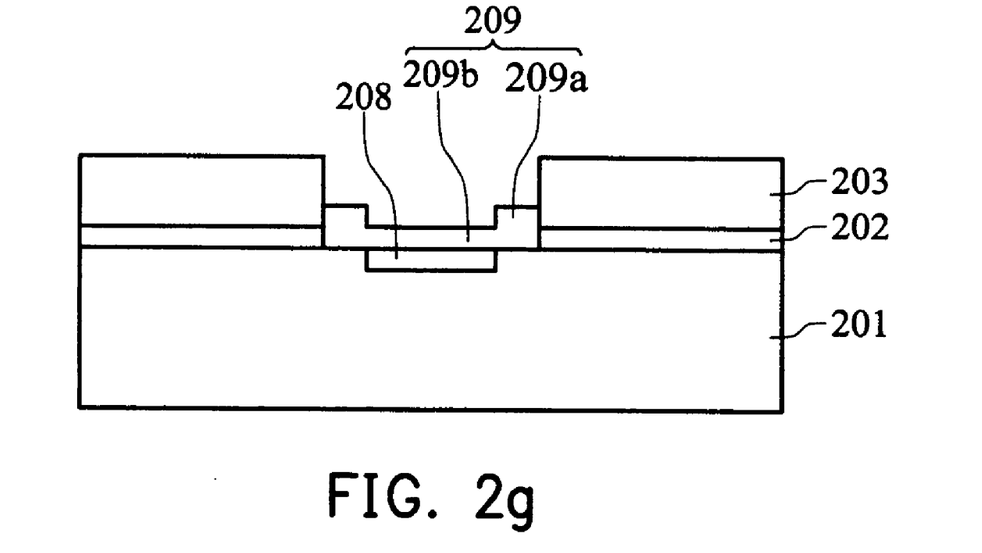

In FIG. 2g, after a thermal oxidation, the second gate dielectric layer 209b on the semiconductor substrate 201 formed in the ion implanted area 208 is thinner than the first gate dielectric layer 209a on the semiconductor substrate 201 outside the ion implanted area 208 because the nitrogen ions in the ion implanted area 208 retard the oxidation speed on the semiconductor 201. Thus, the gate dielectric layer 209 comprises the first gate dielectric layer 209a and the second gate dielectric layer 209b, wherein the second gate dielectric layer 209b is formed closer to the center than the first gate dielectric layer 209a.

Figure 2H:
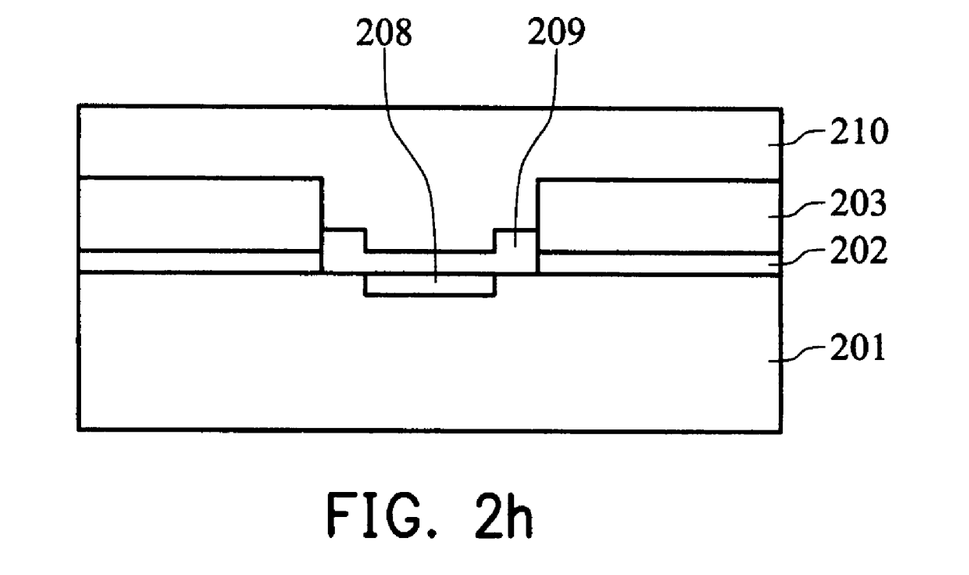

In FIG. 2h, with low pressure chemical vapor deposited to form a conducting layer 210, such as a polysilicon layer or a epi-silicon layer, on the hard mask layer 203 at 525 to 575° C., wherein the opening 206 is filled with the conducting layer 210.

Figure 2I:
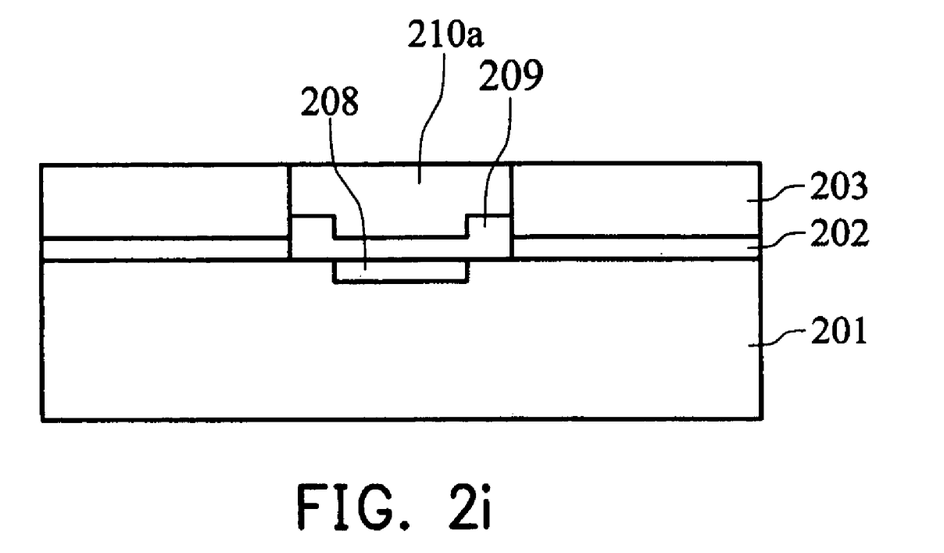

In FIG. 2i, the conducting layer 210 is planarized to expose the hard mask layer 203. The planarization comprises chemical mechanical polishing.

Figure 2J:
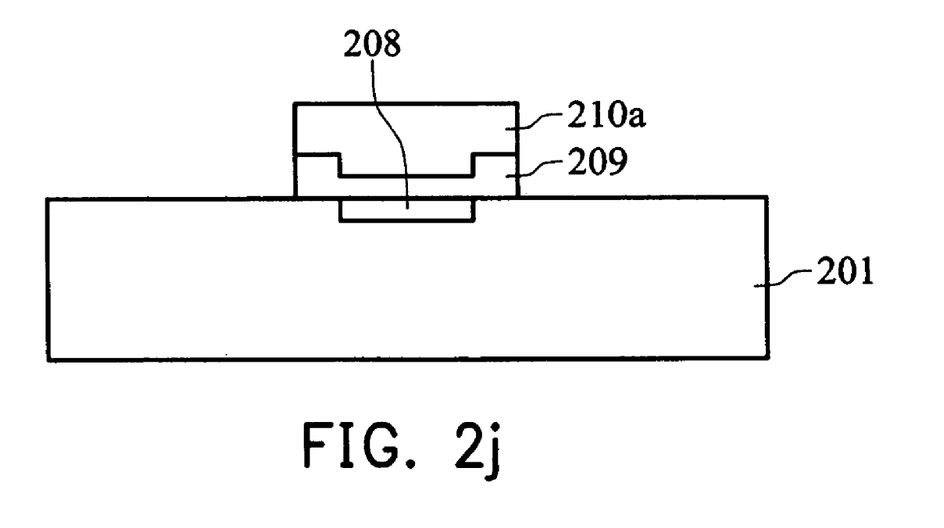

In FIG. 2j, the hard mask layer 203 and the dielectric layer 202 are sequentially removed to leave the conducting layer 210a and gate dielectric layer 209, wherein comprise the gate of a MOS structure.

Figure 2K:
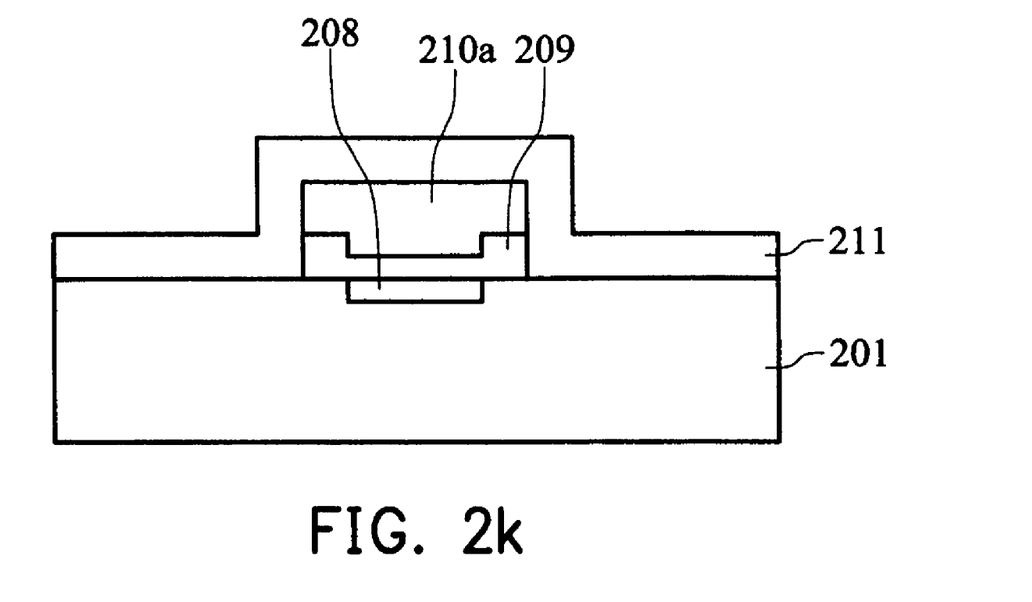

In FIG. 2k, a second insulating layer 211, such as LPCVD oxide, LPCVD nitride, PECVD oxide, or PECVD nitride, is conformally formed on the surface of the conducting layer 210a and the semiconductor substrate 201 at 350 to 850° C.

Figure 2L:
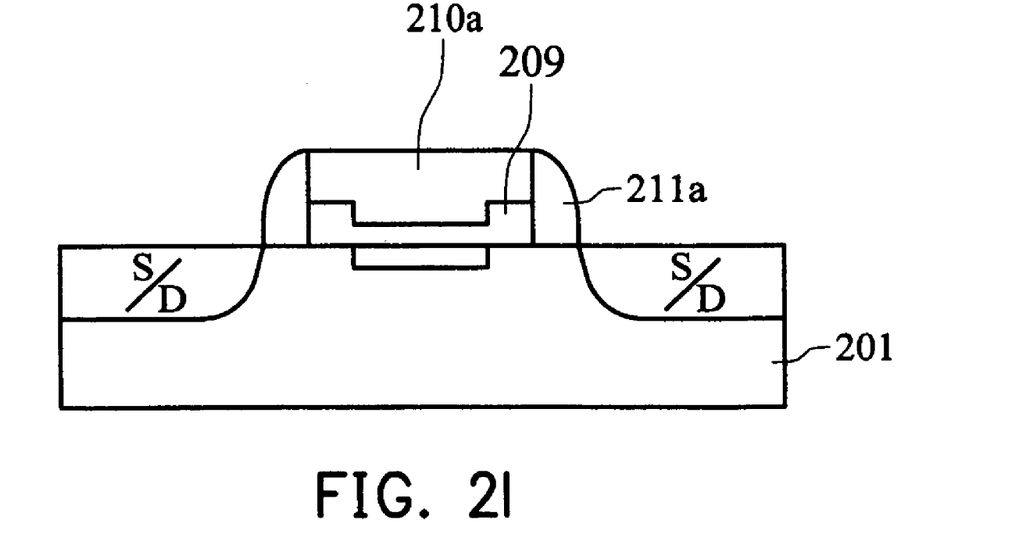

In FIG. 2l, the insulating layer 211 is anisotropically etched to form a second spacer 211a on the sidewall of the conducting layer 210a, wherein the anisotropic etching comprises reactive ion etching or plasma etching. The semiconductor substrate 201 is ion implanted to form a doped S/D area using the conducting layer 210a and the second spacer 211a as masks. The doped S/D area is rapidly thermally annealed to activate ions in the doped S/D area. Thus, the gate with dual gate dielectric layer is completed.

The present invention provides a method for fabricating a dual gate dielectric layer using difference in oxidizing rate between the doped area and non-doped area of the semiconductor substrate. Integration of embodiments of the present invention is relatively easy, and does not require additional masking operations compared to conventional dual gate dielectric layer processes. Additionally, it does not require the use of marginal processes or unusual materials.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for fabricating a gate with dual gate dielectric layer, comprising:
    providing a semiconductor substrate, with a dielectric layer, a hard mask layer, and a patterned photoresist layer with a first opening sequentially formed thereon, wherein the first opening exposes the hard mask layer;
    etching the hard mask layer to form a second opening using the patterned photoresist layer as a mask;
    removing the patterned photoresist layer;
    conformally forming an insulating layer over the hard mask layer and the second opening;
    anisotropically etching the insulating layer to form a spacer on a sidewall of the second opening;
    implanting nitrogen ions into the semiconductor substrate using the hard mask layer and the spacer as masks;
    removing the spacer and the exposed dielectric layer; and
    thermally oxidizing the semiconductor substrate to form a gate oxide layer over a bottom of the second opening using the hard mask layer as a mask.

2. The method for fabricating a gate with dual gate dielectric layer as claimed in claim 1, further comprising:
    forming a conducting layer over the hard mask layer, the second opening filled with the conducting layer;
    planarizing the conducting layer to expose the hard mask layer; and
    removing the hard mask layer.

3. The method for fabricating a gate with dual gate dielectric layer as claimed in claim 2, wherein the conducting layer comprises a polysilicon layer or an epi-silicon layer.

4. The method for fabricating a gate with dual gate dielectric layer as claimed in claim 1, wherein the dielectric layer comprises a pad oxide layer.

5. The method for fabricating a gate with dual gate dielectric layer as claimed in claim 1, wherein the hard mask layer comprises a nitride layer.

6. The method for fabricating a gate with dual gate dielectric layer as claimed in claim 1, wherein the insulating layer comprises an oxide layer.

7. The method for fabricating a gate with dual gate dielectric layer as claimed in claim 1, wherein the method of anisotropic etching comprises a reactive ion etching or a plasma etching.

8. The method for fabricating a gate with dual gate dielectric layer as claimed in claim 1, wherein the method of planarizing comprises chemical mechanical polishing.

9. The method for fabricating a gate with dual gate dielectric layer as claimed in claim 1, wherein the ions are nitrogen ions.

10. A method for fabricating a gate with dual gate dielectric layer, comprising:
- providing a semiconductor substrate, with a dielectric layer and a patterned hard mask layer with an opening sequentially formed thereon;
- forming a spacer on a sidewall of the opening;
- implanting ions into the semiconductor substrate using the spacer and the hard mask as a mask;
- removing the spacer; and
- forming a gate oxide layer on a bottom of the opening after removing the spacer, wherein the gate oxide layer has different thicknesses in the opening.

11. The method for fabricating a gate with dual gate dielectric layer as claimed in claim 10, wherein the gate oxide layer is formed by oxidizing the semiconductor substrate.

12. The method for fabricating a gate with dual gate dielectric layer as claimed in claim 11, wherein the step of implanting ions forms an ion implanted area in a first portion of the substrate in the opening and uncovered by the spacer.

13. The method for fabricating a gate with dual gate dielectric layer as claimed in claim 12, wherein a first portion of the gate oxide layer formed on the first portion of the substrate is thinner than a second portion of the gate oxide layer formed on a second portion of the substrate in the opening but outside of the first portion of the substrate.

14. The method for fabricating a gate with dual gate dielectric layer as claimed in claim 12, wherein ions in the ion implanted area retard oxidation on the first portion of the substrate such that a first portion of the gate oxide layer formed on the ion implanted area is thinner than a second portion of the substrate in the opening but outside of the ion implanted area.

* * * * *